(12) United States Patent
Long (10) Patent No.: US 11,112,666 B2
(45) Date of Patent: Sep. 7, 2021

(54) ARRAY SUBSTRATE AND DISPLAY DEVICE

(71) Applicant: BOE Technology Group Co., Ltd., Beijing (CN)

(72) Inventor: Chunping Long, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/765,276

(22) PCT Filed: Dec. 5, 2019

(86) PCT No.: PCT/CN2019/123401
§ 371 (c)(1),
(2) Date: May 19, 2020

(87) PCT Pub. No.: WO2020/140688
PCT Pub. Date: Jul. 9, 2020

(65) Prior Publication Data
US 2021/0223650 A1    Jul. 22, 2021

(30) Foreign Application Priority Data

Jan. 2, 2019 (CN) .......................... 201920005949.9

(51) Int. Cl.
*G06F 3/041* (2006.01)
*G02F 1/1362* (2006.01)
(Continued)

(52) U.S. Cl.
CPC .... *G02F 1/136286* (2013.01); *G02F 1/13338* (2013.01); *G02F 1/13439* (2013.01);
(Continued)

(58) Field of Classification Search
CPC ... B61L 5/00; E01B 19/00; E01B 7/20; F16M 13/022; Y10T 29/49826; G02F 1/1345;
(Continued)

(56) References Cited

U.S. PATENT DOCUMENTS

2008/0137022 A1    6/2008  Komeno et al.
2009/0122039 A1*   5/2009  Katoh ............... G02F 1/136227
                                                      345/207
(Continued)

FOREIGN PATENT DOCUMENTS

CN    102792219 A    11/2012
CN    102998820 A     3/2013
(Continued)

*Primary Examiner* — Insa Sadio
(74) *Attorney, Agent, or Firm* — Arent Fox LLP; Michael Fainberg (57) ABSTRACT

An array substrate and a display device are provided. The array substrate includes a substrate, which has a display area and a periphery wiring area at the outer side of the display area of the substrate; at least one periphery wiring in the periphery wiring area; an insulating layer on a side of the periphery wiring away from the substrate, wherein a plurality of grooves is formed in the insulating layer in region corresponding to the periphery wiring area, so as to form a barrier wall with the grooves; and a conductive shielding layer on one side of the insulating layer, an orthographic projection of portions, directly facing the grooves, of the periphery wiring on the substrate is within an orthographic projection of the conductive shielding layer on the substrate.

18 Claims, 8 Drawing Sheets

(51) Int. Cl.
*H01L 27/12* (2006.01)
*G02F 1/1333* (2006.01)
*G02F 1/1343* (2006.01)

(52) U.S. Cl.
CPC .. *G02F 1/133345* (2013.01); *G02F 1/133357* (2021.01); *G02F 1/136218* (2021.01); *G06F 3/0412* (2013.01); *H01L 27/124* (2013.01)

(58) Field of Classification Search
CPC ............ G02F 1/136286; G02F 1/1337; G02F 1/1339; G02F 1/1341; G02F 1/13415
See application file for complete search history.

(56) References Cited

U.S. PATENT DOCUMENTS

2013/0027648 A1* 1/2013 Moriwaki ............ G02F 1/1345
 349/138
2013/0063406 A1 3/2013 Nishino et al.

FOREIGN PATENT DOCUMENTS

CN 105304642 A 2/2016
CN 209070278 U 7/2019

* cited by examiner

ARRAY SUBSTRATE AND DISPLAY DEVICE

CROSS REFERENCE TO RELATED APPLICATIONS

This application is a US National Stage of International Application No. PCT/CN2019/123401, filed Dec. 5, 2019, which claims priority to Chinese Patent Application No. 201920005949.9 filed with Chinese Patent Office on Jan. 2, 2019, and entitled "ARRAY SUBSTRATE", which is hereby incorporated by reference in its entirety.

FIELD

The present disclosure relates to the technical field of display, and particularly to an array substrate and a display device.

BACKGROUND

An orientation layer needs to be made on an array substrate of a liquid crystal display so that the liquid crystal can have an initial deflection angle. For example, polyimide is used as a material of the orientation layer, during coating of polyimide, the uncured polyimide has flowability, thus the boundary of coating the polyimide liquid is required to be controlled by some designs.

SUMMARY

An embodiment of the present disclosure provides an array substrate. The array substrate includes: a substrate, which has a display area and a periphery wiring area at outer side of the display area of the substrate; at least one periphery wiring in the periphery wiring area; an insulating layer on a side of the periphery wiring away from the substrate, wherein the insulating layer is provided with a plurality of grooves surrounding the display area, a portion of the insulating layer between adjacent grooves of the plurality of grooves and the grooves form a barrier wall, extension directions of the grooves intersect with the at least one periphery wiring, and the grooves and the at least one periphery wiring have overlapping areas; and a conductive shielding layer on a side of the insulating layer away from the substrate, wherein an orthographic projection of the conductive shielding layer on the substrate covers the overlapping areas of the at least one wiring and the grooves.

Optionally, in the array substrate provided by the present disclosure, the at least one periphery wiring includes a plurality of periphery wirings, the conductive shielding layer includes a plurality of strip shielding electrodes one-to-one corresponding to the periphery wirings, and an orthographic projection of one strip shielding electrode on the substrate covers an orthographic projection of a portion, passing through the barrier wall, of one corresponding periphery wiring on the substrate.

Optionally, in the array substrate provided by the present disclosure, the at least one periphery wiring includes a plurality of periphery wirings, the conductive shielding layer includes at least one block shielding electrode, and an orthographic projection of one block shielding electrode on the substrate covers orthographic projections of portions, passing through the retaining wall structure, of the plurality of periphery wirings on the substrate.

Optionally, in the array substrate provided by the present disclosure, the periphery wiring includes a data line lead.

Optionally, in the array substrate provided by the present disclosure, the periphery wiring includes a common electrode lead; and the common electrode lead includes a plurality of sub-leads connected in parallel, and parallel connection positions of the sub-leads are not overlapped with an orthographic projection of the barrier wall on the substrate.

Optionally, in the array substrate provided by the present disclosure, the conductive shielding layer includes a plurality of sub-strip shielding electrodes one-to-one corresponding to the sub-leads, and an orthographic projection of one sub-strip shielding electrode on the substrate covers an orthographic projection of one corresponding sub-lead on the substrate.

Optionally, the array substrate provided by the present disclosure further includes a metal shielding layer between the substrate and the periphery wiring, wherein the metal shielding layer is insulated from the periphery wiring, and an orthographic projection of the metal shielding layer on the substrate covers the overlapping areas of the periphery wiring and the grooves.

Optionally, in the array substrate provided by the present disclosure, the metal shielding layer is electrically connected with the conductive shielding layer by via holes, and the via holes are formed in the insulating layer and positioned outside the grooves.

Optionally, in the array substrate provided by the present disclosure, the at least one periphery wiring includes a plurality of periphery wirings, the metal shielding layer includes a plurality of strip metal electrodes one-to-one corresponding to the periphery wirings, and an orthographic projection of one strip metal electrode on the substrate covers an orthographic projection of a portion, passing through the barrier wall, of one corresponding periphery wiring on the substrate.

Optionally, in the array substrate provided by the present disclosure, the at least one periphery wiring includes a plurality of periphery wirings, the metal shielding layer includes at least one block metal electrode, and an orthographic projection of one block metal electrode on the substrate covers orthographic projections of portions, passing through the barrier wall, of the plurality of periphery wirings on the substrate.

Optionally, in the array substrate provided by the present disclosure, a pattern of the conductive shielding layer and a pattern of the metal shielding layer are only arranged in an area of the periphery wiring passing through the barrier wall, or the metal shielding layer has a pattern shielding fan-out area of the periphery wiring.

Optionally, in the array substrate provided by the present disclosure, the insulating layer includes: a passivation layer on a side of the periphery wiring away from the substrate; and a planarization layer on a side of the passivation layer away from the periphery wiring, wherein the barrier wall is only formed in the planarization layer.

Optionally, in the array substrate provided by the present disclosure, a material of the conductive shielding layer is indium tin oxide, and the conductive shielding layer is on a side of the planarization layer away from the substrate.

Optionally, the array substrate provided by the present disclosure further includes a pixel electrode in the display area, and the conductive shielding layer is in the same layer with the pixel electrode.

Optionally, in the array substrate provided by the present disclosure, a material of the conductive shielding layer is metal, and the conductive shielding layer is between the planarization layer and the passivation layer.

Optionally, the array substrate provided by the present disclosure further includes a touch electrode lead, and the conductive shielding layer is in the same layer with the touch electrode lead.

Optionally, the array substrate provided by the present disclosure further includes a metal pixel electrode, and the conductive shielding layer is in the same layer with the metal pixel electrode.

The present disclosure further provides a display device, including the above array substrate provided by the present disclosure.

DETAILED DESCRIPTION

On an array substrate of a liquid crystal display, a barrier wall is arranged on four sides within a sealant of a non-display area and is formed by grooving in a planarization layer. The polyimide liquid of an orientation film flows into grooves of the barrier wall, herein, the barrier wall of the orientation film is designed to be wavy, the polyimide liquid may flow towards the barrier wall along an arc-shaped edge between a convex part and a concave part, an acting force between the polyimide liquid and the barrier wall is buffered, so that the polyimide liquid cannot cross the barrier wall, and furthermore the coating boundary of the polyimide liquid is controlled.

However, since the planarization layer at the position where the barrier wall is located is hollowed, a passivation layer with the thickness being only about 0.2 micrometers is arranged on source/drain metal layer wirings, i.e., periphery wirings for protection, which easily results in two problems as follows: (1) friction electrostatic damage is more likely to occur here in an orientation process; and (2) the periphery wirings here are more likely to adsorb impurity ions on a liquid crystal layer to result in uneven brightness of local display so as to generate various traces.

The technical solutions in the embodiments of the present disclosure will be clearly and completely described below in combination with the accompanying drawings. Obviously, the described embodiments are only some embodiments instead of all embodiments of the present disclosure. All other embodiments obtained by a person of ordinary skilled in the art on the basis of the embodiments of the present disclosure without creative efforts shall fall within the protection scope of the present disclosure.

Figure 1:
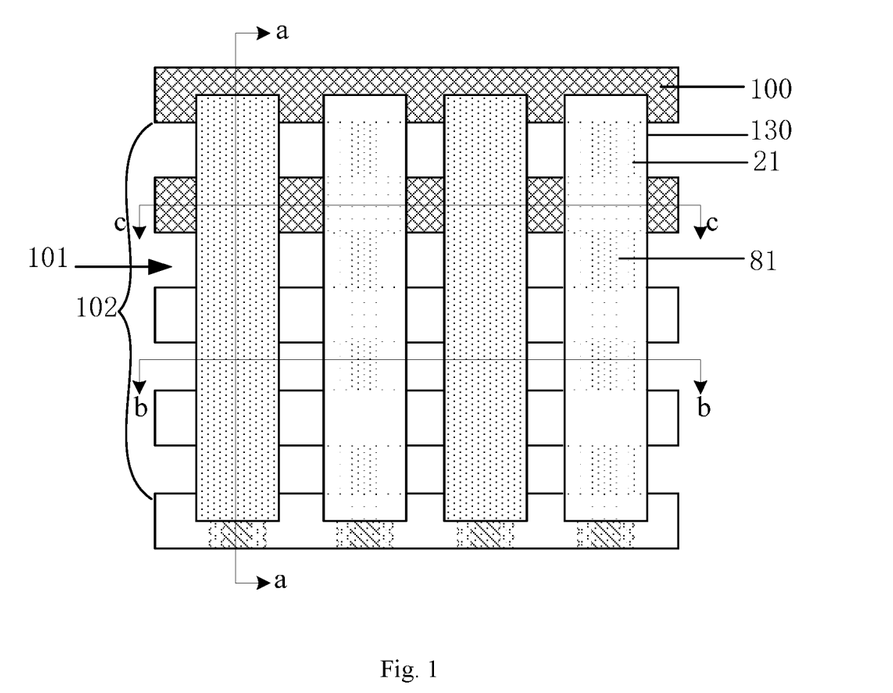
FIG. 1 is a planar view of an array substrate according to an embodiment of the present disclosure.
Figure 2:
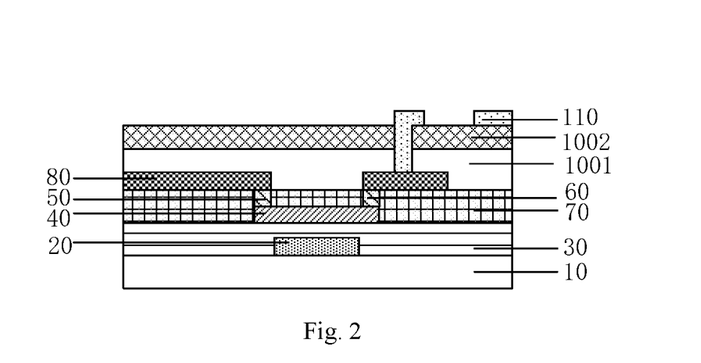
FIG. 2 is a sectional view of a pixel thin film transistor in the array substrate according to an embodiment of the present disclosure.
Figure 3:
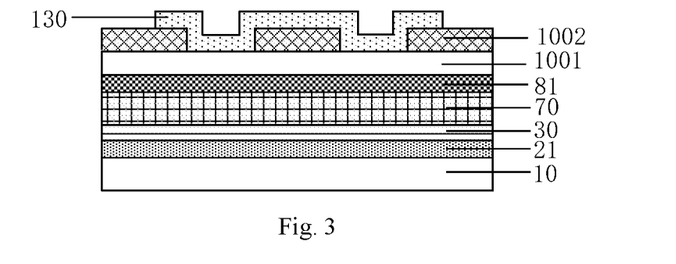
FIG. 3 is a sectional view of the array substrate in FIG. 1 along aa direction.
Figure 4:
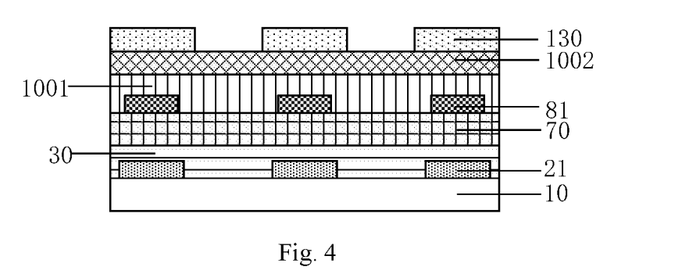
FIG. 4 is a sectional view of the array substrate in FIG. 1 along bb direction.
Figure 17:
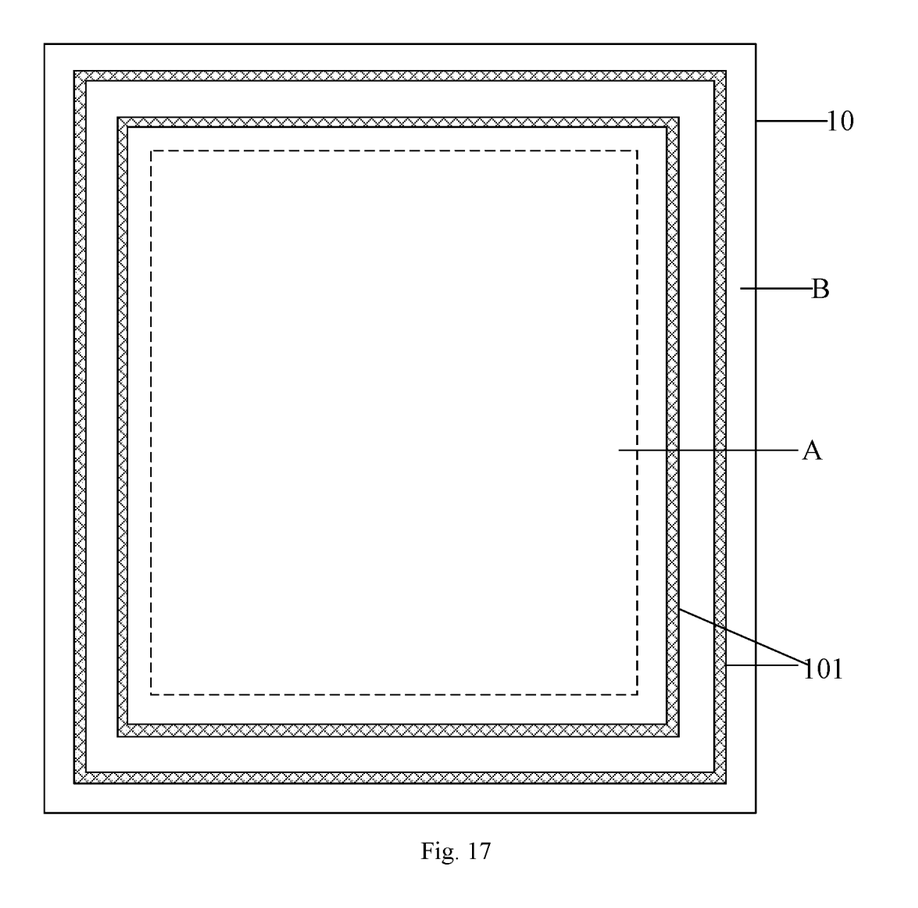
FIG. 17 is a top view of an array substrate according to an embodiment of the present disclosure.

Referring to FIG. 1-FIG. 3, the present disclosure provides an array substrate, as shown in FIG. 17, which includes: a substrate 10 which has a display area A and a periphery wiring area B at outer side of the display area A of the substrate 10, wherein FIG. 1 only shows the periphery wiring area B; at least one wiring 81 in the periphery wiring area B; an insulating layer 100 on the side of the periphery wiring 81 away from the substrate, wherein the insulating layer 100 is provided with a plurality of grooves 101 surrounding the display area, the portions of the insulating layer 100 between the adjacent grooves 101 and the grooves 101 forms a barrier wall 102, the extension direction of the groove 101 intersects with the periphery wiring 81, and the groove 101 and the periphery wiring 81 have an overlapping area, wherein FIG. 1 is explained with an example in which the extension direction of the groove 101 is horizontal direction, and the extension direction of the periphery wirings 81 is vertical direction; and a conductive shielding layer 130 on the side of the insulating layer 100 away from the substrate 10, wherein an orthographic projection of the conductive shielding layer 130 on the substrate 10 covers the overlapping area of the periphery wiring 81 and the groove 101.

In the above array substrate, the array substrate includes a substrate 10 which has the display area and the periphery wiring area, the periphery wiring 81 is arranged in the periphery wiring area, and the array substrate further includes the insulating layer 100 arranged on the side of the periphery wiring away from the substrate 10, and the conductive shielding layer 130 arranged on the side of the insulating layer 100 away from the substrate 10. Specifically, in the above array substrate, the insulating layer 100 is provided with the plurality of grooves 101 in region corresponding to the periphery wiring area to form the barrier wall 102, and an orthographic projection of a portion, directly facing the groove 101, of the periphery wiring 81 on the substrate 10 is located within an orthographic projection of the conductive shielding layer 130 on the substrate 10.

In the array substrate according to the present disclosure, the conductive shielding layer 130 is formed on one side of the insulating layer 100, and the conductive shielding layer 130 shields damage of the outside to the periphery wiring 81 in region corresponding to the groove 101 in the insulating layer 100. Obviously, the conductive shielding layer 130 further forms a protection for the periphery wiring 81 in region corresponding to the barrier wall 102, and the conductive shielding layer 130 can shield an external electric field and static electricity and effectively solve the technical problem such as electrostatic discharge.

Therefore, in the above array substrate, by changing a structure on the substrate 10, it is convenient to form secondary protection for the periphery wiring 81 in region corresponding to the barrier wall 102, and can avoid the problem of electrostatic damage easily caused here in the orientation process, and can avoid the phenomenon of uneven brightness of the local display and generated various traces due to that the periphery wiring 81 here adsorbs the impurity ions on the liquid crystal layer.

Specifically, in the above array substrate provided by the embodiment of the present disclosure, as shown in FIG. 2 and FIG. 3, the insulating layer 100 may include: a passivation layer 1001 on a side of the periphery wiring 81 away from the substrate 10; and a planarization layer 1002 located on a side of the passivation layer 1001 away from the periphery wiring 81, wherein the barrier wall 102 is only formed in the planarization layer 1002.

Specifically, in the above array substrate provided by the embodiment of the present disclosure, there are various possible preparation materials for the conductive shielding layer 103.

When the preparation material of the conductive shielding layer 130 is an indium tin oxide semiconductor, as shown in FIG. 2, the display area of the array substrate provided by the present disclosure may further include a transparent pixel electrode 110, wherein the conductive shielding layer 130 may be prepared in the same layer with the transparent pixel electrode 110. The conductive shielding layer 130 is prepared in the same layer with the transparent pixel electrode 110, so that the thickness of the array substrate can be reduced, and production steps can be simplified.

Specifically, the following technical solutions are described with an example in which the preparation material of the conductive shielding layer 130 is the indium tin oxide semiconductor, and as shown in FIG. 2, the display area of the array substrate provided by the present disclosure may further include a gate 20, a gate insulation layer 30, an active layer 40, a source/drain (a source 50 and a drain 60 is disposed in the same layer) and an etch stop layer 70 which are sequentially arranged on the substrate 10 in the direction from the substrate 10 to the planarization layer 1002, wherein the periphery wiring 81 and the data line 80 are arranged in the same layer and are located on the side of the etch stop layer 70 away from the substrate 10, the passivation layer 1001 is located on the side of the data line 80 away from the substrate 10, the planarization layer 1002 is located on the side of the passivation layer 1001 away from the substrate 10, and the transparent pixel electrode 110 is located on the side of the planarization layer 1002 away from the substrate 10.

On the basis of the above technical solutions, there are various possibilities for a shielding relationship between the periphery wiring 81 and the conductive shielding layer 130, and specifically, the shielding relationship at least includes one of following structures.

First Structure

A plurality of periphery wirings 81 are arranged, the conductive shielding layer 130 includes a plurality of strip shielding electrodes one-to-one corresponding to the periphery wirings 81, and an orthographic projection of one strip shielding electrode on the substrate 10 covers an orthographic projection of a portion, passing through the barrier wall 102, of one corresponding periphery wiring 81 on the substrate 10.

Figure 5:
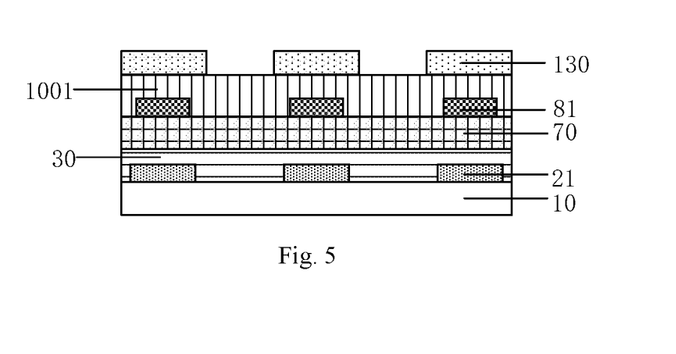
FIG. 5 is a sectional view of the array substrate in FIG. 1 along cc direction.

Specifically, referring to FIG. 1, FIG. 3 and FIG. 5, the plurality of strip shielding electrodes of the conductive shielding layer 130 may one-to-one correspond to the periphery wirings 81, that is, each strip shielding electrode corresponds to one periphery wiring 81, and orthographic projections of the strip shielding electrodes on the substrate 10 cover orthographic projections of portions, located in the region of the barrier wall 102, of the periphery wirings 81 one-to-one corresponding to the strip shielding electrodes.

Known from the above analysis, each strip shielding electrode shields the corresponding periphery wiring 81, so that an external electric field and static electricity are shielded for the periphery wiring 81, and the technical problem of electrostatic discharge is effectively solved.

It should be noted that the strip shielding electrode may be approximately strip-shaped, and the edges of strip shielding electrode may be straight line or wavy line, the descriptions thereof are omitted herein.

Of course, in addition to the structure that the strip shielding electrodes one-to-one corresponds to the periphery wirings 81, there also exists a structure that a plurality of strip shielding electrodes shield the same periphery wiring 81, or a structure that one strip shielding electrode shields a plurality of periphery wirings 81, or a structure that all the above structures exist together. It should be noted that the arrangement of the strip shielding electrodes and the periphery wirings 81 may be changed according to an actual production design demand.

Figure 6:
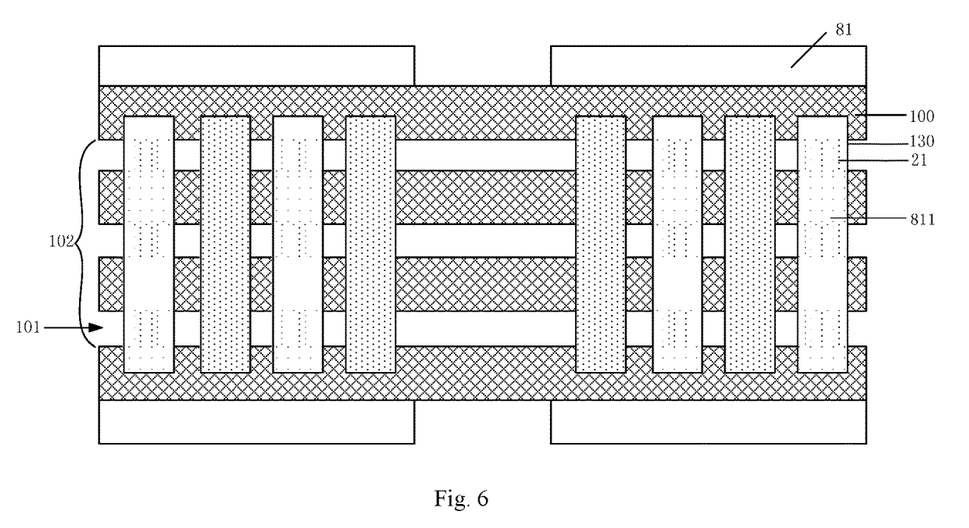
FIG. 6 is a planar view of another array substrate according to an embodiment of the present disclosure.

Specifically, in the above array substrate provided by the embodiment of the present disclosure, the periphery wirings 81 include data line leads by which the data lines in the display area are led to corresponding connection terminals. The periphery wirings 80 may further include common electrode leads configured to lead common electrodes in the display area to the corresponding connection terminals, the common electrode leads are relatively wide, and therefore, as shown in FIG. 6, each wide common electrode lead may be segmented into a plurality of sub-leads 811 connected in parallel, and connect positions of the sub-leads 811 are not overlapped with the barrier wall 102. Each common electrode lead with relatively large width is designed to be formed by parallel connection of a plurality of sub-leads 811 with relatively small widths, so that the widths of the common electrode leads are reduced, in this way, the coverage area of the common electrode leads can be reduced, it is convenient to shield the external electric field and static electricity, and the technical problem of electrostatic discharge is effectively solved.

For the plurality of sub-leads 811 in the above technical solution, as shown in FIG. 6, the following arrangement may be adopted: each strip shielding electrode includes a plurality of sub-strip shielding electrodes, and an orthographic projection of one sub-strip shielding electrode on the substrate 10 covers an orthographic projection of one sub-lead 811 on the substrate 10.

It should be noted that referring to a correspondence between the strip shielding electrodes and the periphery wirings 81, the sub-strip shielding electrodes may one-to-one corresponding to the sub-leads 811 (as shown in FIG. 6), and each sub-strip shielding electrode shields the corresponding sub-lead 811; or a plurality of sub-strip shielding electrodes shield the same first sub-lead 811; or one sub-strip shielding electrode shield a plurality of first sub-leads 811, which is not limited herein. In addition, the above various structures may be combined together, and the arrangement of the sub-strip shielding electrodes and the first sub-leads 811 may be changed according to an actual production design demand.

On the basis of the above technical solutions, as an implementation, as shown in FIG. 1, the array substrate provided by the present disclosure may further include a metal shielding layer 21 between the substrate 10 and the periphery wiring 81, the metal shielding layer 21 is insulated from the periphery wiring 81, and the overlapping areas of the periphery wiring 81 and the grooves 101 are covered by an orthographic projection of the metal shielding layer 21 on the substrate 10. Generally, the metal shielding layer 21 may be formed in the same layer with the gate 20.

Figure 7:
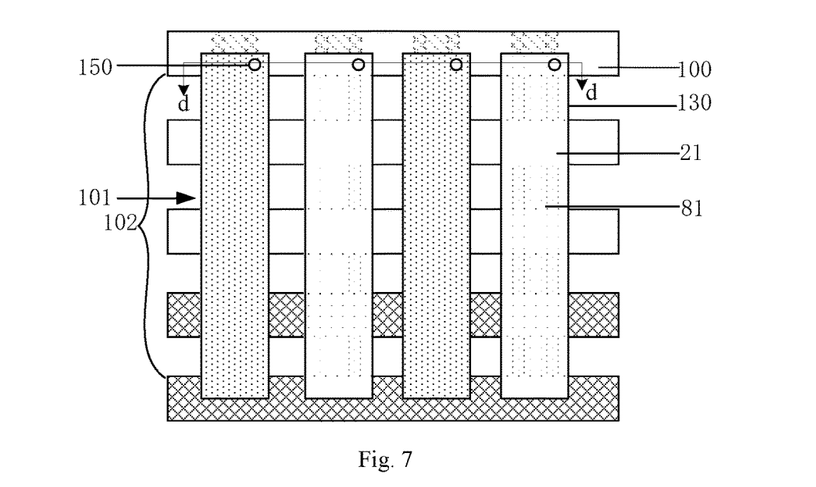
FIG. 7 is a planar view of another array substrate according to an embodiment of the present disclosure.
Figure 8:
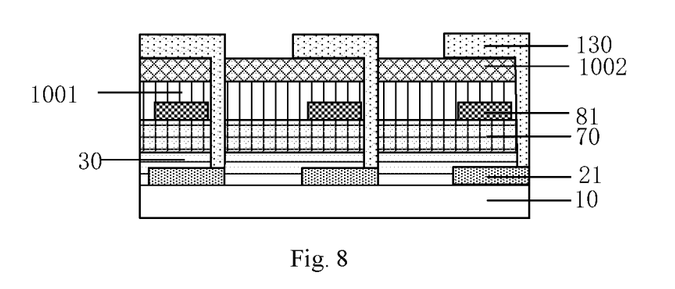
FIG. 8 is a sectional view of the array substrate in FIG. 7 along dd direction.

On the basis of the above technical solutions, the metal shielding layer 21 may further be electrically connected with the conductive shielding layer 130 by via hole 150, and the via hole 150 may be formed in the insulating layer 100 and outside the grooves 101, as shown in FIG. 7 and FIG. 8.

Specifically, in the array substrate provided by the present disclosure, as shown in FIG. 6, the metal shielding layer 21 includes a plurality of strip metal electrodes one-to-one corresponding to the periphery wirings 81, and an orthographic projection of one strip metal electrode on the substrate 10 covers an orthographic projection of a portion, passing through the barrier wall 102, of one corresponding periphery wiring 81 on the substrate 10. In this way, the strip metal electrode and the strip shielding electrode corresponding to one periphery wiring 81 may be electrically connected through the via hole 150, and generally, the strip shielding electrode can cover the strip metal electrode, that is, the area of the strip shielding electrode is greater than that of the strip metal electrode.

Or, in the array substrate provided by the present disclosure, the metal shielding layer 21 may include at least one block metal electrode, and an orthographic projection of one block metal electrode on the substrate 10 covers orthographic projections of portions, passing through the barrier wall 102, of the plurality of periphery wirings 81 on the substrate 10. In this way, the plurality of strip shielding electrodes corresponding to the plurality of periphery wirings 81 can be electrically connected with one block metal electrode through the via holes 150.

Figure 9:
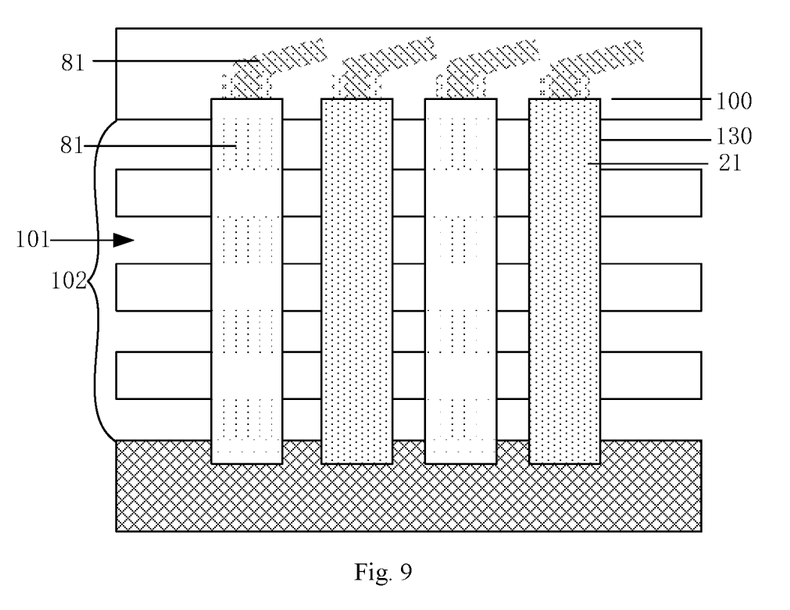
FIG. 9 is a planar view of further array substrate according to an embodiment of the present disclosure.

As another implementation: in the array substrate provided by the present disclosure, referring to FIG. 9, a pattern of the conductive shielding layer 130 and a pattern of the metal shielding layer 21 may be only arranged in areas, passing through the barrier wall 102, of the periphery wirings 81, that is, the pattern of the conductive shielding layer 130 and the pattern of the metal shielding layer 21 may not be arranged in the area, outside the barrier wall 102, of the periphery wirings 81, in this way, the thickness of the array substrate can be reduced.

Figure 10:
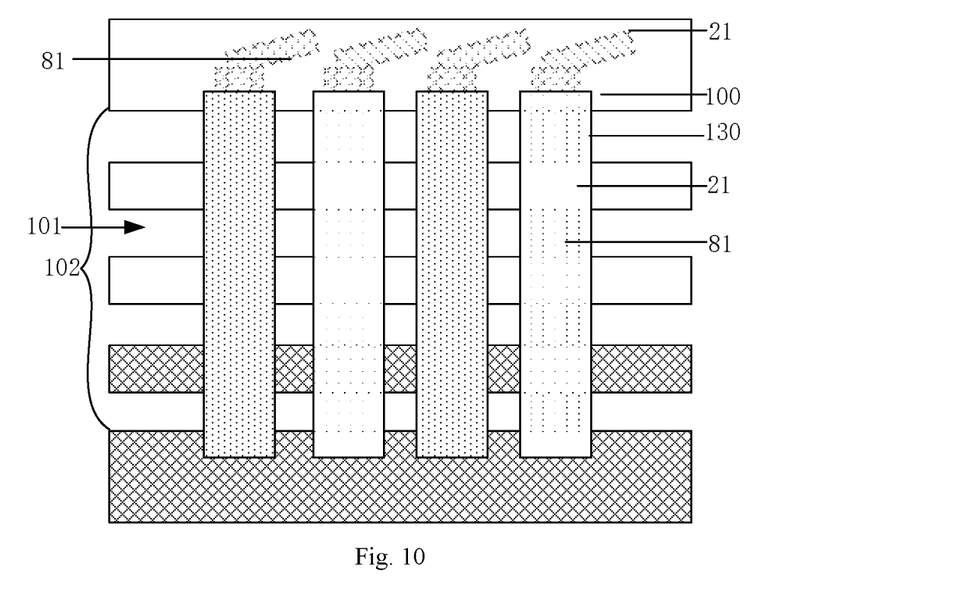
FIG. 10 is a planar view of yet further array substrate according to an embodiment of the present disclosure.

Or, referring to FIG. 10, the metal shielding layer 21 has a pattern shielding fan-out area of the periphery wiring 81, that is, a pattern of the metal shielding layer 21 is always arranged below the periphery wirings 81, and in the fan-out areas, an orthographic projection of the metal shielding layer 21 on the substrate 10 is located within orthographic projections of the periphery wirings 81 on the substrate 10.

Second Structure

Figure 11:
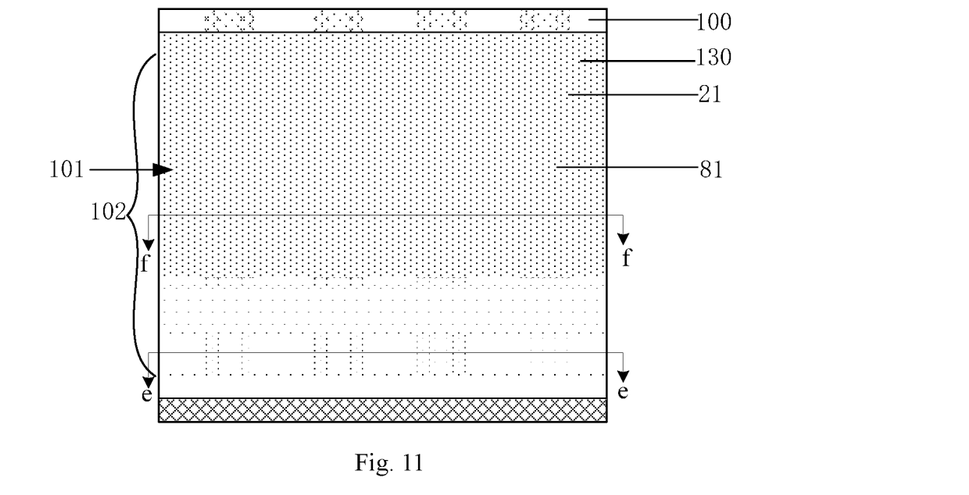
FIG. 11 is a planar view of further another array substrate according to an embodiment of the present disclosure.
Figure 12:
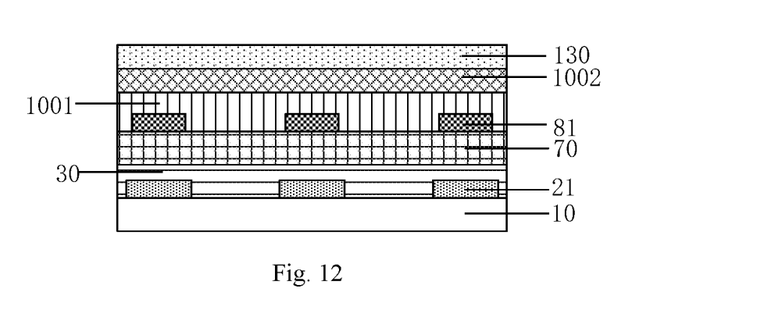
FIG. 12 is a sectional view of the array substrate in FIG. 11 along ee direction.
Figure 13:
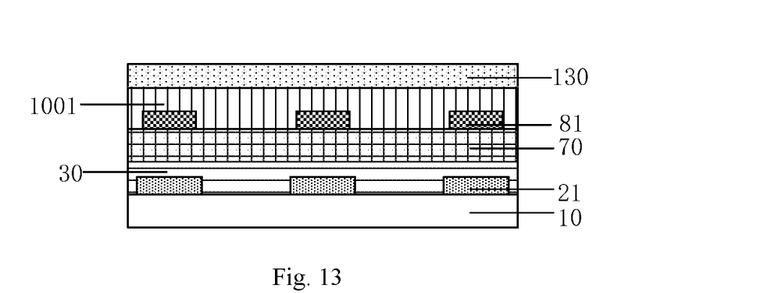
FIG. 13 is a sectional view of the array substrate in FIG. 11 along ff direction.

Referring to FIG. 11 to FIG. 13, a plurality of periphery wirings 81 are arranged, the conductive shielding layer 130 may include at least one block shielding electrode, and an orthographic projection of one block shielding electrode on the substrate 10 covers orthographic projections of portions, passing through the barrier wall 102, of the plurality of periphery wirings 81 on the substrate 10. Due to that the conductive shielding layer 130 includes the block shielding electrode, the preparation process can be simplified, and the production efficiency can be improved.

Figure 14:
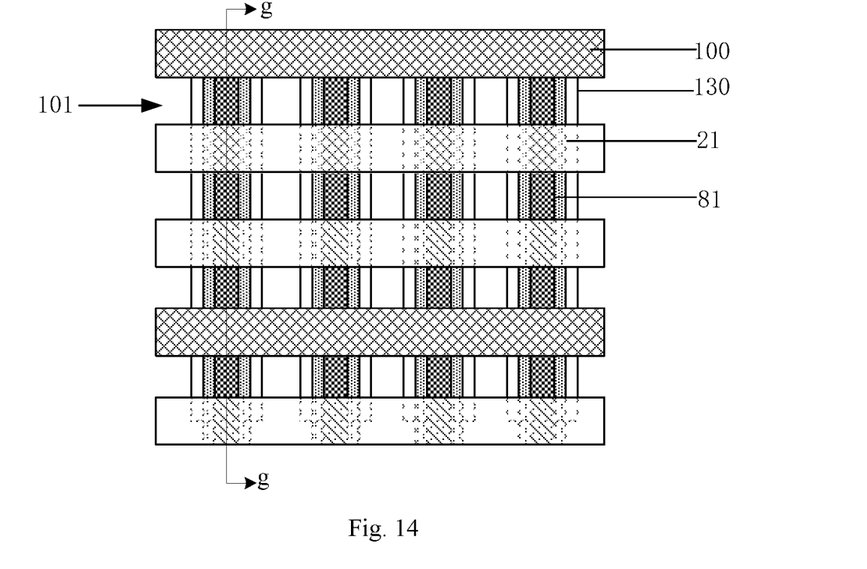
FIG. 14 is a planar view of yet further another array substrate according to an embodiment of the present disclosure.
Figure 15:
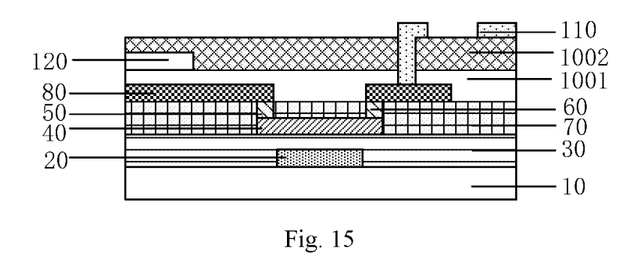
FIG. 15 is a sectional view of another pixel thin film transistor in the array substrate according to an embodiment of the present disclosure.
Figure 16:
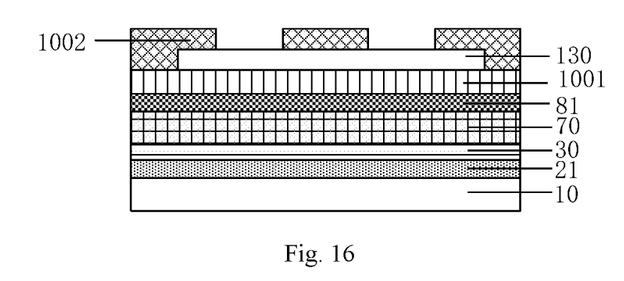
FIG. 16 is a sectional view of the array substrate in FIG. 14 along gg direction.

In addition, when the preparation material of the conductive shielding layer 130 is metal, referring to FIG. 14 to FIG. 16, the conductive shielding layer 130 may be arranged between the planarization layer 1002 and the passivation layer 1001, and the detailed structures in the above implementations in which the preparation material of the conductive shielding layer 130 is metal are not described herein.

Of course, when the array substrate provided by the present disclosure may further include a touch electrode lead 120, the conductive shielding layer 130 may be prepared in the same layer with the touch electrode lead 120, referring to FIG. 14 to FIG. 16.

It should be noted that the display device applying the above array substrate is of an in cell touch (a touch panel function is embedded into a liquid crystal pixel) structure.

In addition, when the array substrate provided by the present disclosure further includes the metal pixel electrode, the conductive shielding layer 130 may also be prepared in the same layer with the metal pixel electrode, and the descriptions thereof are omitted herein.

Based on the same inventive concept, an embodiment of the present disclosure further provides a display device, including the array substrate in the above embodiments. The display device may be any product or component with a display function, such as a liquid crystal panel, a mobile phone, a tablet personal computer, a television, a display, a notebook computer, a digital photo frame and a navigator. The problem solving principle of the display device is similar to that of the above array substrate, and therefore, the implementation of the display device can refer to that of the above array substrate, the descriptions thereof are omitted herein.

Evidently those skilled in the art can make various modifications and variations to the invention without departing from the spirit and scope of the invention. Thus the invention is also intended to encompass these modifications and variations therein as long as these modifications and variations come into the scope of the claims of the invention and their equivalents.

The invention claimed is:

1. An array substrate, comprising:
    a substrate, having a display area and a periphery wiring area at outer side of the display area of the substrate;
    at least one periphery wiring in the periphery wiring area;
    an insulating layer on a side of the periphery wiring away from the substrate, wherein the insulating layer is provided with a plurality of grooves surrounding the display area, a portion of the insulating layer between adjacent grooves of the plurality of grooves and the grooves form a barrier wall, extension directions of the grooves intersect with the at least one periphery wiring, and the grooves and the at least one periphery wiring have overlapping areas; and
    a conductive shielding layer on a side of the insulating layer away from the substrate, wherein an orthographic projection of the conductive shielding layer on the substrate covers the overlapping areas of the at least one periphery wiring and the grooves.

2. The array substrate according to claim 1, wherein the at least one periphery wiring includes a plurality of periphery wirings, the conductive shielding layer comprises a plurality of strip shielding electrodes one-to-one corresponding to the periphery wirings, and an orthographic projection of one strip shielding electrode on the substrate covers an orthographic projection of a portion, passing through the barrier wall, of the corresponding periphery wiring on the substrate.

3. The array substrate according to claim 1, wherein the at least one periphery wiring includes a plurality of periphery wirings, the conductive shielding layer comprises at least one block shielding electrode, and an orthographic projection of one block shielding electrode on the substrate covers orthographic projections of portions, passing through the barrier wall, of the plurality of periphery wirings on the substrate.

4. The array substrate according to claim 1, wherein the periphery wiring comprises a data line lead.

5. The array substrate according to claim 1, wherein the periphery wiring comprises a common electrode lead; and the common electrode lead comprises a plurality of sub-leads connected in parallel, and parallel connection positions of the sub-leads are not overlapped with an orthographic projection of the barrier wall on the substrate.

6. The array substrate according to claim 5, wherein the conductive shielding layer comprises a plurality of sub-strip shielding electrodes one-to-one corresponding to the sub-leads, and an orthographic projection of one sub-strip shielding electrode on the substrate covers an orthographic projection of one corresponding sub-lead on the substrate.

7. The array substrate according to claim 1, further comprising a metal shielding layer between the substrate and the periphery wiring, wherein the metal shielding layer is insulated from the periphery wiring, and an orthographic projection of the metal shielding layer on the substrate covers the overlapping areas of the periphery wiring and the grooves.

8. The array substrate according to claim 7, wherein the metal shielding layer is electrically connected with the conductive shielding layer by via holes, and the via holes are formed in the insulating layer and positioned outside the grooves.

9. The array substrate according to claim 7, wherein the at least one periphery wiring includes a plurality of periphery wirings, the metal shielding layer comprises a plurality of strip metal electrodes one-to-one corresponding to the periphery wirings, and an orthographic projection of one strip metal electrode on the substrate covers an orthographic projection of a portion, passing through the barrier wall, of one corresponding periphery wiring on the substrate.

10. The array substrate according to claim 7, wherein the at least one periphery wiring includes a plurality of periphery wirings, the metal shielding layer comprises at least one block metal electrode, and an orthographic projection of one block metal electrode on the substrate covers orthographic projections of portions, passing through the barrier wall, of the plurality of periphery wirings on the substrate.

11. The array substrate according to claim 7, wherein a pattern of the conductive shielding layer and a pattern of the metal shielding layer are only arranged in an area of the periphery wiring passing through the barrier wall, or, the metal shielding layer has a pattern shielding a fan-out area of the periphery wiring.

12. The array substrate according to claim 1,
wherein the insulating layer comprises:
a passivation layer on a side of the periphery wiring away from the substrate; and
a planarization layer on a side of the passivation layer away from the periphery wiring, wherein the barrier wall is only formed in the planarization layer.

13. The array substrate according to claim 12, wherein a material of the conductive shielding layer is indium tin oxide, and the conductive shielding layer is on a side of the planarization layer away from the substrate.

14. The array substrate according to claim 13, further comprising a pixel electrode in the display area, wherein the conductive shielding layer is in a same layer with the pixel electrode.

15. The array substrate according to claim 12, wherein a material of the conductive shielding layer is metal, and the conductive shielding layer is between the planarization layer and the passivation layer.

16. The array substrate according to claim 15, further comprising a touch electrode lead, wherein the conductive shielding layer is in a same layer with the touch electrode lead.

17. The array substrate according to claim 15, further comprising a metal pixel electrode, wherein the conductive shielding layer is in a same layer with the metal pixel electrode.

18. A display device, comprising the array substrate according to claim 1.

* * * * *